United States Patent [19]

Spiro et al.

[11] Patent Number: 5,152,930
[45] Date of Patent: Oct. 6, 1992

[54] CARBON CHALCOGENIDE MACROMOLECULAR COMPOSITION AND PROCESS FOR PREPARATION THEREOF

[75] Inventors: Clifford L. Spiro, Niskayuna; William F. Banholzer, Scotia, both of N.Y.

[73] Assignee: General Electric Company, Schenectady, N.Y.

[21] Appl. No.: 654,697

[22] Filed: Feb. 13, 1991

Related U.S. Application Data

[62] Division of Ser. No. 545,152, Jun. 28, 1990, Pat. No. 5,045,355.

[51] Int. Cl.$^5$ .................... H01B 1/00; H01B 1/06; C08G 75/00
[52] U.S. Cl. .................... 252/500; 252/518; 252/521; 528/373; 528/378
[58] Field of Search .................... 252/500, 518, 521; 528/387, 373

[56] References Cited

U.S. PATENT DOCUMENTS

| | | | |
|---|---|---|---|
| 3,386,970 | 6/1968 | Pitt | 528/387 |
| 3,390,140 | 6/1968 | Pitt & Pallos | 528/387 |
| 3,717,619 | 2/1973 | Hartzler | 260/79 |
| 4,115,168 | 9/1978 | Buonadonna et al. | 149/109.6 |
| 4,452,727 | 6/1984 | Frommer et al. | 252/500 |
| 4,462,929 | 7/1984 | Shacklette et al. | 252/500 |
| 4,599,194 | 7/1986 | Frommer et al. | 252/500 |
| 4,620,944 | 11/1986 | Armand et al. | 252/518 |
| 4,765,928 | 8/1988 | Thakur | 252/500 |
| 4,816,547 | 3/1989 | Tsukamoto et al. | 528/387 |
| 4,962,158 | 10/1990 | Kobayashi | 252/500 |
| 4,963,616 | 10/1990 | Jeneke | 252/500 |
| 5,035,835 | 7/1991 | Asakawa et al. | 252/500 |

OTHER PUBLICATIONS

Brown, A. and Whalley, E., Poly (Carbon Diselenide) Jun. 1968, Notes, Inorganic Chemistry, vol. 7, No. 6, 1254-1255.

Butcher, E., Weston, J., and Gebbie, H., High-Pressure Preparation of Black Solid Carbon Disulfide (1964), J. Chem. Phys. 41,2554-2555.

Whalley, E., Structure of Bridgman's Black Carbon Disulphide, (1960), Can. J. Chem. 38, 2105-2108.

Bridgman, P. W., Freezing Parameters and Compressions of Twenty-One Substances to 50,000 KG/CM2, (1941, Pro. Amer. Acad. Arts and Sci. 74,399-424.

Primary Examiner—Paul Lieberman
Assistant Examiner—William S. Parks
Attorney, Agent, or Firm—Sudhir G. Deshmukh; William H. Pittman

[57] ABSTRACT

A carbon chalcogenide macromolecular composition prepared from carbon dichalcogenide and to a process for the preparation thereof. A carbon dichalcogenide, for example, carbon disulfide, in entrained in an inert gas, and the mixture formed therefrom is passed over a hot tungsten filament wherein carbon disulfide is degraded into fragments. The fragments are then deposited onto a surface of a non-reactive substrate. The deposited fragments recombine to form the macromolecular composition. A significant characteristic of the composition is its threshold voltage above which its electrical resistance drops precipitously. This characteristic also exhibits a unique temperature dependence. Dopants may be added to the composition to reduce the electrical resistance.

17 Claims, 3 Drawing Sheets

CARBON CHALCOGENIDE MACROMOLECULAR COMPOSITION AND PROCESS FOR PREPARATION THEREOF

This application is a division, of application Ser. No. 07/545,152, filed Jun. 28, 1990 now U.S. Pat. No. 5,045,355.

BACKGROUND OF THE INVENTION

The present invention is directed to preparing carbon chalcogenide macromolecular composition from carbon dichalcogenide and to the macromolecular composition produced thereby.

Bridgman [Proc. Am. Acad. Art. Sci., 74,399 (1941)] reported polymerization of carbon disulfide into a black solid powder. According to Bridgman, carbon disulfide polymerizes into a black solid powder at a pressure of about 55 kilobars and at temperatures above 175° C. The polymerization requires about 7 hours of exposure to the aforementioned conditions. The black powder made by Bridgman decomposes at about 200° C. into carbon and sulfur.

Whalley [Can.J.Chem., 38,2105 (1960)] describes Bridgman's black powder as linear chains of alternating carbon and sulfur atoms in the following recurring moiety,

Since the process used to form Bridgman's black powder requires more than 5000 atmospheres of pressure, the process is extremely cumbersome and difficult to implement in practice.

Tsukamoto et al, U.S. Pat. No. 4,816,547, describe the preparation of carbon dichalcogenide polymers by subjecting carbon dichalcogenide dissolved in an inert solvent and in the presence of anionic polymerization catalyst to temperatures of about −100° C. to 50° C. for several hours. The polymerization process requires violent stirring of the mixture to achieve homogeneous dispersion of the catalyst and is performed at about one atmosphere of pressure. Tsukamoto et al also disclose steps to achieve polymerization of carbon dichalcogenides at temperatures above the boiling point of carbon disulfide (46° C.) and carbon diselenide (126° C.) by carrying out the polymerization at elevated pressures of up to ten atmospheres. Tsukamoto et al further disclose the carbon dichalcogenide polymers structure having C=S, or C=Se or C=Te bonding and a carbon to chalcogen ratio of 1:2.

The foregoing prior art processes either require high pressures or complex catalysis to complete the polymerization of carbon dichalcogenide. Furthermore, the prior art processes disclose polymers having very high carbon: chalcogen ratios.

SUMMARY OF THE INVENTION

It is the object of the present invention to provide an improvement over the prior art processes for preparing carbon chalcogenide macromolecular compositions.

It is also an object of the present invention to provide an improved optical window for the transmission of infrared light wherein the window has hardness in excess of sapphire but less than that of diamond.

It is further an object of the present invention to provide an improved semiconducting diode.

It is further an object of the present invention to provide an amorphous semiconductor having improved electrical properties.

It is yet another object of the present invention to provide improved carbon chalcogenide macromolecular compositions having a low chalcogen to carbon ratio.

It is further an object of the present invention to provide a process for preparing carbon chalcogen macromolecular compositions from carbon dichalcogenide by chemical vapor deposition [CVD].

It is yet another object of the present invention to provide a process for degrading and recombining carbon dichalcogenide in the absence of a solvent or a catalyst, to form carbon chalcogenide macromolecular compositions.

It is also an object of the present invention to provide a process for degrading and recombining carbon dichalcogenide at subatmospheric pressures into carbon chalcogenide macromolecular compositions.

In accordance with the present invention, there is provided a process for preparing a carbon chalcogenide macromolecular composition by vaporizing carbon dichalcogenide; energizing the carbon dichalcogenide vapor to degrade the carbon dichalcogenide into fragments; depositing the fragments onto a surface of a thermally stable substrate; and recombining the fragments deposited on the substrate into the carbon chalcogenide macromolecular composition. The carbon chalcogenide macromolecular composition comprises, and preferably consists of substantially aromatic carbon and chalcogen, having a ratio of chalcogen atoms to carbon atoms of less than one. The carbon chalcogenide macromolecular composition is further composed of free carbon radicals interlinked within the composition. The chalcogen in the macromolecular composition is sulfur, selenium or tellurium.

The term carbon dichalcogenide herein means one or more members of the group consisting of carbon disulfide, carbon diselenide and carbon ditelluride. Carbon disulfide is particularly preferred in the present invention.

Other objects and advantages of the present invention will be readily apparent from the following description and drawings which illustrate exemplary embodiments of the present invention.

DETAILED DESCRIPTION OF THE INVENTION

Figure 1:
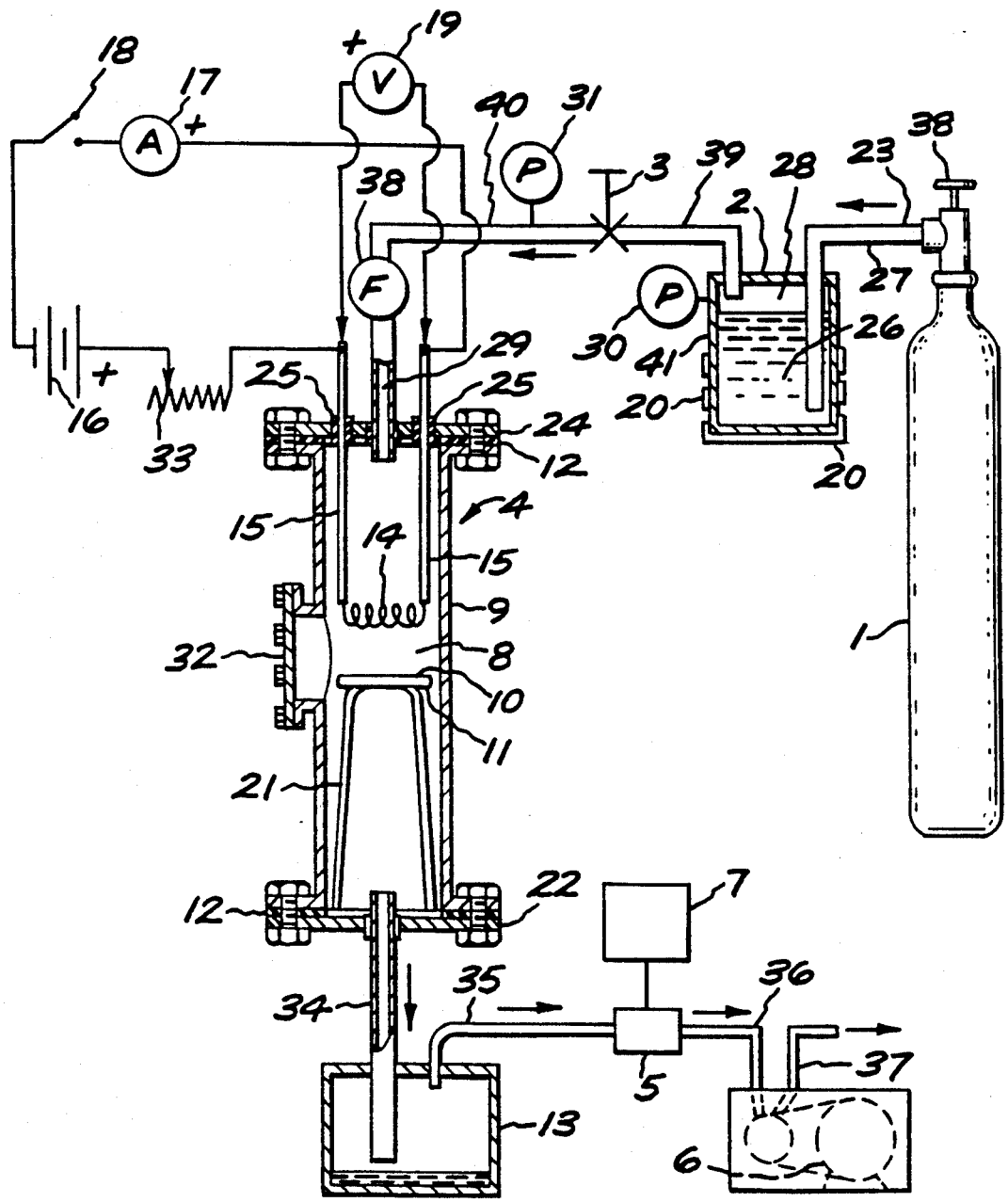
FIG. 1 is a schematic representation of the apparatus used to prepare the macromolecular composition of the present invention.

In accordance with the present invention, the carbon dichalcogenide is vaporized by the application of heat. The vapor of carbon dichalcogenide is then conveyed to a reactor chamber. Alternatively the vapor can be entrained in an inert gas such as argon, nitrogen, helium and xenon for conveying the inert gas/carbon dichalcogenide vapor mixture to a reactor chamber Carbon dichalcogenide in the mixture is then energized to degrade into fragments by one of various energizing methods hereinafter described. For example, dichalcogenide is energized by (1) passing the mixture over a nonreactive filament heated to a required temperature; (2) flowing the mixture through an oven maintained at a desired temperature; (3) exposing the mixture to a light of desired frequency; (4) or exposing the mixture to a microwave radiation of sufficient intensity. It should be pointed out that the aforementioned techniques are well known to those skilled in the art. However, the invention also contemplates using any other well known techniques that will bring about the aforementioned results. The fragments are then deposited on one or more substrates, that are either stationary (batch process) or mobile (continuous process). The substrates are preferably maintained at a temperature less than that of the fragments. Once the fragments are deposited on the substrate, they recombine to form carbon dichalcogenide macromolecular composition of the present invention.

The composition of the present invention has a macromolecular structure substantially of aromatic carbon and a chalcogen having a ratio of chalcogen atoms to carbon atoms of less than one. The aromatic carbons in the composition further have free radicals which interlink and which continue to interlink over a period of time ultimately reaching a state of stability. The chalcogen of the composition is selected from the group consisting of sulfur, selenium and tellurium. The chalcogen-carbon atom ratio can be varied by altering the reaction conditions such as the flow rate of the mixture, the temperature of the mixture and that of the substrate, the distance between the substrate and the filament, etc.

When carbon sulfide macromolecular composition was prepared from carbon disulfide, the carbon sulfide macromolecular composition comprised substantially aromatic carbon and sulfur having the ratio of sulfur atoms to carbon atoms from about 0.01 to 0.5. The carbon sulfide macromolecular composition further comprised free carbon radicals interlinked therein. The following bond-structure is illustrative of the carbon sulfide macromolecular composition:

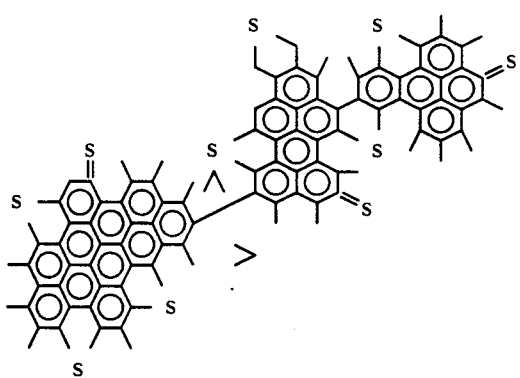

The sub-structures within the macromolecular composition, though substantially aromatic, are not necessarily coplanar. A certain amount of bond rotation, as illustrated above, may exist. The aforestated bond rotation contributes to the structural stability of the macromolecular composition. The presence of the aforementioned bond rotation is inferred from a direct observation of the macromolecular composition through scanning tunneling microscopy and also due to an apparent lack of lubricity, usually associated with typical coplanar structures such as the ones found in graphite.

Similar structures are possible when selenium or tellurium is used as the chalcogen in the carbon chalcogenide macromolecular composition.

The compositions of the present invention can be doped for reducing the electrical resistance of the composition. Dopants such as, for example, iodine, chlorine, bromine, fluorine, perchlorate ion, sulfur hexafluoride, boron tetrafluoride etc. can be used. The dopants may be introduced either before the degradation of the carbon dichalcogenide/inert gas mixture or after the formation of the macromolecular composition by well known techniques such as exposing the composition to the dopant vapor, to the dopant dissolved in a reagent, etc. The present invention also contemplates the use of other dopants and alternative art recognized processes for introducing the dopants into the composition.

Referring now to FIG. 1, there is shown a typical chemical vapor deposition apparatus used in preparing the carbon sulfide macromolecular composition of the present invention.

As shown in FIG. 1, cylinder 1 containing argon gas 27 is connected through cylinder valve 38 via tubing 23 to $CS_2$ saturator 2. To those skilled in the art, it will be obvious to substitute argon with other inert gases such as helium, nitrogen, xenon and the like. $CS_2$ saturator 2 comprises container 41 partially filled with liquid $CS_2$ 26 and substantially wrapped with heat tape 20. Heat tape 20 is used for controlling the temperature of liquid $CS_2$ 26 and $CS_2$ vapor 28. An electrical system used for controlling the temperature of the heat tape 20 is not shown. It will be obvious to those skilled in the art that other similar arrangements may be used for controlling the temperature of liquid $CS_2$ 26 and $CS_2$ vapor 28.

The exit end of tubing 23 is located below the level of liquid $CS_2$ 26 so that argon gas 27 can bubble through liquid $CS_2$ 26. The inlet end of tubing 39 is located in the zone of $CS_2$ vapor 28, and the outlet end of tubing 39 is connected to the inlet of needle valve 3, wherein the outlet of needle valve 3 is connected to the inlet end of tubing 40. The outlet end of tubing 40 is sealably connected to upper metal flange 24 of reactor 4. Pressure gauge 30 measures the pressure of argon gas 27/$CS_2$ vapor 28 mixture, hereinafter the mixture, whereas pressure gauge 31 measures the downstream pressure of the mixture controlled by needle valve 3. Flowmeter 38 measures the flow rate of the mixture entering reactor 4.

A conventional chemical vapor deposition reactor 4 comprises hollow cylinder 9 made from high heat materials such as quartz, having its upper and lower openings sealably capped off by upper metal flange 24 and lower metal flange 22, respectively. Sealably pliable gaskets 12 such as those made from silicone rubber are disposed between the upper and lower flanges and the openings of cylinder 9, so as to hermetically seal a chamber within reactor 4. The observation of chemical reactions in the chamber of reactor 4 and the temperature measurements of filament 14 and substrate 11 are accomplished by viewing through the transparent wall of cylinder 9. Alternatively, a hermetically sealed window 32, located at about a midway position on cylinder 9, can be also used for accomplishing the aforementioned observations. It should be noted that the invention contemplates other similar arrangements having varied physical structures and dimensions for achieving the desired results.

A pair of conductive rods 15, such as those made from copper, are sealably mounted through a pair of insulating grommets 25 located on upper metal flange 24. The lower extremities of copper rods 15 are positioned approximately midway in the chamber of reactor 4 and filament 14 is fixedly attached to said lower extremities. Filament 14 is made of a nonreactive material such as tungsten. The upper extremities of copper rods 15 are connected to electrical power supply 16 through switch 18, ammeter 17 and rheostat 33. It will be obvious to those skilled in the art that power supply 16 may be AC or DC and filament 14 may be made of other nonreactive materials. Voltmeter 19 is also connected across the upper extremities of copper rods 15 for measuring a voltage across filament 14.

Target substrate 11 attached to adjustable stand 21 is placed on an upper surface of lower metal flange 22 such that a surface of target substrate 11 is directly below filament 14 located inside the chamber of reactor 4. Target substrate 11 can be made from any number of materials such as, for example, metal; metal alloy; silicon; ceramics such as alumina, quartz, ceramic glasses and sapphire; polymers; metal salts such as potassium and sodium halides, but it is not to be construed as to exclude other substrates that could be coated. By adjusting the height of stand 21, gap 8 between filament 14 and target substrate 11 can be widened or narrowed. One or more substrates located at same or varying distances from filament 14 may be utilized. It is also contemplated that the substrates may be either stationary, when used in a batch process or mobile, when used in a continuous process.

Tubing 34 is sealably connected between lower metal flange 22 of reactor 4 and filter trap 13. Tubing 35 is then sealably connected between trap 13 and exhaust throttle valve 5. Exhaust throttle valve 5 is controlled by exhaust valve controller 7. A conventional electrical arrangement used for operating controller 7 is not shown, however its operation will be obvious to those skilled in the art. Tubing 36 is sealably connected between exhaust throttle valve 5 and the inlet end of vacuum pump 6. Vacuum pump 6 is then exhausted through tubing 37. All tubing is made of stainless steel. However, to those skilled in the art it will be obvious to use tubing made from other similar materials.

In a typical experiment, needle valve 3 was closed and exhaust throttle valve 5 was fully opened by means of exhaust valve controller 7. The system was then evacuated for a period of time, typically about half an hour, sufficient to remove all extraneous gases from the system. Cylinder valve 38 on argon cylinder 1 was then opened to pressurize $CS_2$ saturator 2, typically to a pressure of about 1800 torr, as indicated on pressure gauge 31. Needle valve 3 was then adjusted to allow the passage of the mixture into reactor 4. Exhaust throttle valve 5 was concurrently adjusted to achieve a desired pressure in the chamber of reactor 4. A period of time was allowed for the system to reach a steady state having the desired argon/$CS_2$ mixture. During the same time period the system was purged of any residual gases. Typically, a period not less than half an hour was required before the chemical deposition process was commenced. The flow rate of the mixture indicated on flow meter 38 was regulated by adjusting needle valve 3, argon cylinder valve 38 and exhaust throttle valve 5.

The chemical vapor deposition process commenced upon heating filament 14 by passing a current through it. By adjusting rheostat 33 to a required voltage, the current level flowing through filament 14 was adjusted to a desired filament temperature. A calibration chart between filament current and filament temperature supplied the filament current necessary to achieve the desired filament temperature. The filament temperature used was between about 200° C. and 4,000° C., preferably in the range of about 1500° C. to 2500° C. The temperature of target substrate 11 was in the range of about 20° C. to 1,000° C., the preferred range being about 200° C. to 500° C. An optical pyrometer was used to confirm the temperature settings.

Once the filament temperature and the flow rate of the mixture reached the desired levels, film 10 having a black metallic luster appeared on the surface of substrate 11. Film 10 was continuously deposited until the desired thickness was attained. Typically, reactor 4 was allowed to function in this manner for several minutes to several days. After switching off the power to the filament, the reactor was allowed to cool. The vacuum was then discharged, and the substrate having the macromolecular composition thereon, was removed. In general the macromolecular composition could be deposited to a desired thickness, ranging from micro-thin films to macroscopic free-standing materials. Deposition rates of over 10 micrometers per hour were observed. The composition can be left on the surface of substrate or it can be separated from the substrate by scraping or by dissolving the substrate, and removing the film therefrom.

Numerous films and powders of the macromolecular composition were prepared from carbon disulfide. The films were amorphous on atomic dimensions, and most of the films were extremely hard, having hardness in excess of sapphire (hardness=9 on the Mohs scale) but less than that of diamond (hardness=10 on the Mohs scale). The films were chemically inert, being stable in organic solvents, alkali and strong mineral acids. Only by prolonged boiling in concentrated nitric acid/perchloric acid mixtures could these films be sufficiently decomposed for chemical analysis. The films were oxidatively thermally stable to about 300° C. The films were visibly opaque and metallic in appearance, but were transparent to a significant degree to infrared light, showing virtually no absorption maxima in the range 200–4000 cm$^{-1}$. The macromolecular composition film by itself or as a coating on a substrate transparent to infrared light could be used as an optical window for transmitting infrared light.

Figure 2:
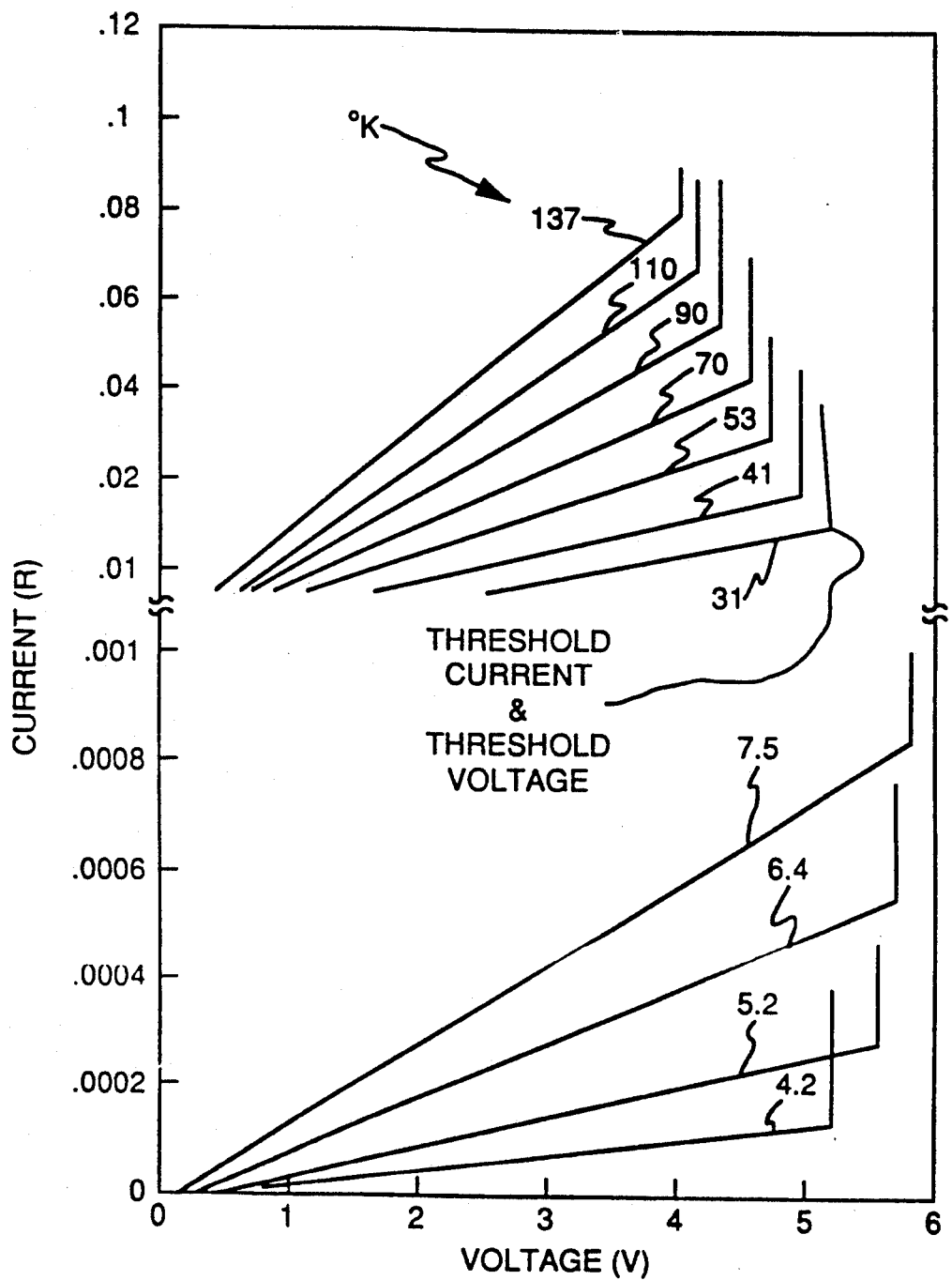
FIG. 2 illustrates the effect of temperature on the current when the applied voltage to the composition is increased.
Figure 3:
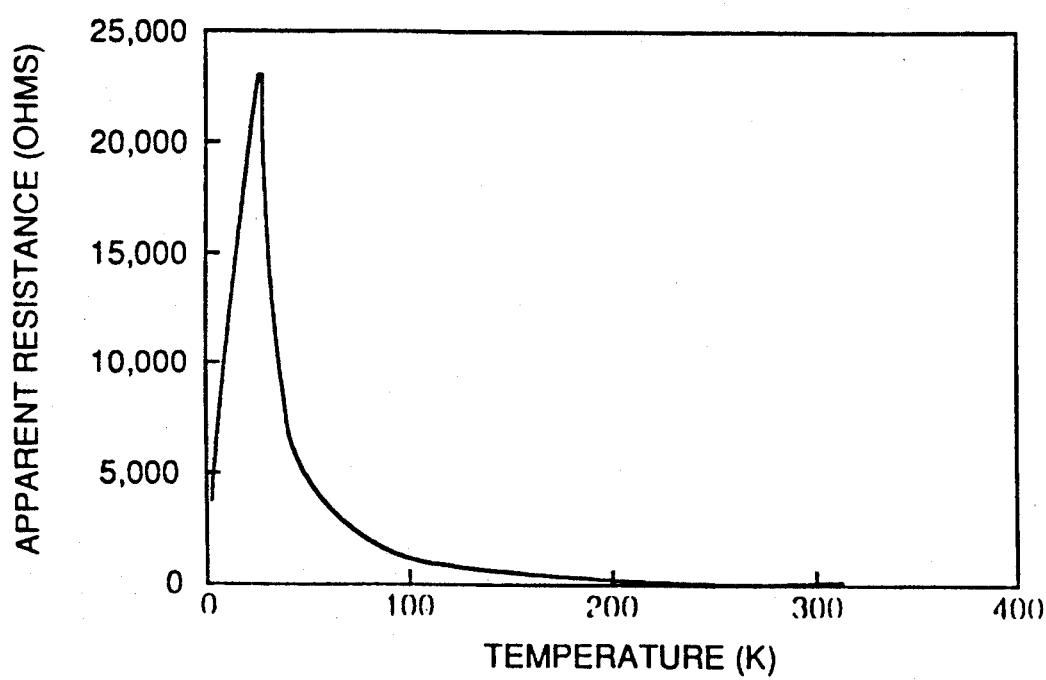
FIG. 3 illustrates the effect on the apparent resistance, at a given fixed current, when the temperature is increased.

The films were also semiconducting with resistivities at about 1–100,000 ohm-centimeters when measured by compressing films between two 1 cm metallic disks and then measuring the system resistance. The electrical resistance of the films, as measured by a four probe apparatus, was observed to range from about less than 1 ohm to greater than about 1,000,000 ohms, depending on the film thickness and the film composition. One of the significant properties of the macromolecular composition, as shown in FIG. 2, is its threshold voltage above which the apparent electrical resistance drops precipitously. The apparent resistance is defined as a ratio of voltage to current. Such a behavior is a typical characteristic of semiconductor diodes. FIG. 2 further illustrates the unique temperature dependence of the current/voltage characteristics of the macromolecular composition. As the temperature of the film is lowered, the threshold current is lowered. The threshold voltage however, increases to a maximum, and then it reduces with further lowering of the film temperature. As shown in FIG. 2, the threshold currents vary by over seven orders of magnitude. The threshold voltage ranges from 1 to 10 volts, however the threshold voltage is highly temperature dependent in the cryogenic temperature region having a temperature sensitivity of up to about 500 mV per degree Kelvin. It should be noted that the typical commercial silicon diode thermometers have sensitivities of only about 2 to 30 mV per degree Kelvin in the same cryogenic temperature region. Another consequence of the aforementioned phenomenon is the dependence of the electrical resistance on both the temperature of the macromolecular composition and the voltage applied to it. FIG. 3 illustrates the apparent resistance as a function of the temperature at a given fixed current. As FIG. 3 shows the apparent resistance drops significantly in a very narrow temperature range. The macromolecular composition also exhibits a thermoelectric and photoelectric behavior.

The electrical resistance of the carbon sulfide composition of the present invention can be reduced by introducing a dopant into the carbon sulfide composition by the methods described above. A range of the aforementioned dopants can be employed to reduce the electrical resistance of the doped carbon sulfide macromolecular composition.

The composition may be used, for example, as a hard abrasion resistance surface coating, an optical window for the passage of an infrared light, a resistor, a varistor, a thermister, a temperature sensing probe, a thermoelectric device, a photoelectric device, a diode with a very large surface area, a surge protector, a semiconductor or as a semiconducting diode with or without the dopant added to the composition. The importance of the macromolecular composition to the electronic industry is further enhanced by the fact that the composition is inexpensive, easily synthesized in simple steps by using a single reagent, uniformly and rapidly deposited over large areas of various types of substrates, thermally stable, amorphous, lightweight, moisture resistant, chemically resistant, etc.

By slight modifications and adjustments to the aforementioned processes and the process parameters, carbon selenide and carbon telluride macromolecular compositions can be also formed from carbon diselenide and carbon ditelluride respectively.

It should be understood that the energization and the degradation of carbon dichalcogenide into the fragments followed by their deposition and the recombination on a substrate surface into the macromolecular composition can be accomplished in a variety of ways. The process of the present invention can be easily adapted to alternative well known energization techniques suitable for the degradation of carbon dichalcogenide, such as for example, exposing the carbon dichalcogenide to microwave radiation of sufficient intensity; to light emission of sufficient frequency or to thermal radiation from a furnace of sufficient temperature such that the carbon dichalcogenide entrained in the vapor mixture is degraded into the fragments.

EXAMPLES

The process in the examples set forth below was carried out in an equipment similar to that described above and shown in FIG. 1.

EXAMPLE 1

Carbon disulfide in a $CS_2$ saturator was heated to 43° C. and argon gas at 25 psig was passed through the $CS_2$ saturator to yield a vapor mixture of $CS_2$ and argon gas. The flow rate of the vapor mixture was held at 50 SCCM by adjusting a needle valve adjacent to the $CS_2$ saturator and an exhaust throttle valve on the vacuum system. The mixture was conveyed into a conventional chemical vapor deposition (CVD) reactor chamber having an electrically heated tungsten filament and a silicon wafer target substrate provided with means for adjusting its position relative to the filament. The filament was heated to 2000° C. and the surface temperature of the substrate was maintained at 300° C. An optical pyrometer was used to determine the filament and the substrate temperatures. The substrate was positioned one inch away from the filament. The reactor pressure was reduced to 3 Torr by adjusting the exhaust throttle valve. Upon commencement of the process, a black metallic film appeared within minutes on the substrate. After 4 hours the electric current to the filament was switched off and the reactor was allowed to cool down before the vacuum was discharged. The substrate was removed and the composition was scraped from the substrate for an elemental analysis.

According to the elemental analysis using the combustion method, performed on the composition taken from the substrate, the ratio of sulfur to carbon atoms in the composition was 0.301.

EXAMPLE 2

The same process parameters as described in Example 1 were used except the reaction time of the process was increased to 16 hours.

It was determined by the elemental analysis that the ratio of sulfur to carbon atoms was 0.330.

EXAMPLE 3

The same process parameters as described in Example 1 were used except the gap between the filament and the substrate was increased to 1¾ inches and the reaction time was increased to 22 hours.

It was determined by the elemental analysis that the ratio of sulfur to carbon atoms was 0.361.

EXAMPLE 4

The same process parameters as those described in the Example 1 were used except the gap between the filament and the substrate was increased to 2 inches and the reaction time was increased to 22½ hours.

It was determined by the elemental analysis that the ratio of sulfur to carbon atoms was 0.480.

EXAMPLE 5

The same process parameters as those described in Example 4 were used except the macromolecular composition was obtained from the under side of the silicone wafer, i.e. the side that was not directly exposed to the filament.

It was determined by the elemental analysis that the ratio of sulfur to carbon atoms was 0.364.

It will be understood that the foregoing description and drawings are only illustrative of the present invention and it is not intended that the invention be limited thereto. Many other specific embodiments of the present invention will be obvious to one skilled in the art in view of this disclosure. All substitutions, alterations and modifications of the present invention which come within the scope of the following claims or to which the present invention is readily susceptible without departing from the spirit and scope of this disclosure are considered part of the present invention.

What is claimed is:

1. A carbon chalcogenide composition consisting of a macromolecular structure of aromatic carbon and chalcogen, having a ratio of chalcogen atoms to carbon atoms of about 0.01 to 0.5, the composition having free carbon radicals interlinked therein.

2. The carbon chalcogenide composition according to claim 1, wherein chalcogen is selected from the group consisting of sulfur, selenium and tellurium.

3. The carbon chalcogenide macromolecular composition of claim 1 wherein the chalcogen is sulfur.

4. The composition of claim 1 further comprising a dopant selected from the group consisting of iodine, bromine, chlorine, fluorine, perchlorate ion, sulfur hexafluoride and boron tetrafluoride.

5. A carbon sulfide composition consisting of a macromolecular structure of aromatic carbon and sulfur, having a ratio of sulfur atoms to carbon atoms of about 0.01 to 0.5, the composition having free carbon radicals interlinked therein.

6. The carbon sulfide composition of claim 5, wherein the composition is a powder.

7. The carbon sulfide composition of claim 5, wherein the composition is a film.

8. The doped composition of claim 5 further comprising a dopant selected from the group consisting of iodine, bromine, chlorine, fluorine, perchlorate ion, sulfur hexafluoride and boron tetrafluoride.

9. A carbon sulfide composition as in claim 5 prepared according to a process comprising:
   entraining carbon disulfide in an argon gas to form a mixture;
   passing said mixture into a CVD reactor chamber over a tungsten filament heated to about 1500°-25° C.;
   thermally degrading said carbon disulfide entrained in said mixture into fragments;
   depositing said fragments onto a target substrate maintained at about 200° to 500° C.; and
   recombining said fragments on said substrate to form said carbon sulfide composition.

10. The carbon sulfide composition according to claim 9 wherein said tungsten filament is positioned from 1 to 2 inches from said target substrate.

11. The carbon sulfide composition according to claim 9 wherein pressure in said CVD chamber is 3 Torr.

12. A carbon sulfide composition consisting of a macromolecular structure of aromatic carbon and sulfur, having a ratio of sulfur atoms to carbon atoms of about 0.01 to 0.5, the composition having:
   a hardness of more than 9 and less than 10 on the Mohs scale;
   an ability to transmit infrared light;
   a chemical stability in organic solvents, alkali and strong mineral acids; and
   a resistivity of about 1-100,000 ohm-centimeters when measured by compressing a film of said composition between two metallic discs of one centimeter diameter.

13. The carbon sulfide composition according to claim 12 wherein a current/voltage characteristics of said composition is as per the graph shown in FIG. 2.

14. The carbon sulfide composition according to claim 12 wherein an apparent resistance of said composition as a function of temperature is as per the graph shown in FIG. 3.

15. The carbon sulfide composition according to claim 12, which further comprises a dopant selected from the group consisting of iodine, chlorine, bromine, fluorine, perchlorate ion, sulfur hexafluoride and boron tetrafluoride.

16. A carbon chalcogenide composition as in claim 1 prepared according to a process comprising:
   entraining carbon dichalcogenide in an argon gas to form a mixture;
   passing said mixture into a CVD reactor chamber over a tungsten filament heated to about 200°-4,000° C.;
   thermally degrading said carbon dichalcogenide entrained in said mixture into fragments;
   depositing said fragments onto a target substrate maintained at about 20° to 1000° C. and positioned 1 to 2 inches from said filament; and
   recombining said fragments on said substrate to form said carbon chalcogenide composition.

17. The carbon chalcogenide composition according to claim 16 wherein said carbon dichalcogenide is carbon disulfide, carbon diselenide or carbon ditelluride.

* * * * *